(12) United States Patent
Kaneko et al.

(10) Patent No.: US 9,500,715 B2
(45) Date of Patent: Nov. 22, 2016

(54) SECONDARY BATTERY TESTER

(71) Applicant: Futao Kaneko, Niigata-shi, Niigata (JP)

(72) Inventors: Futao Kaneko, Niigata (JP); Takahiro Kawakami, Niigata (JP); Kazunari Shinbo, Niigata (JP); Akira Baba, Niigata (JP); Keizo Kato, Niigata (JP); Shigetoshi Miyazaki, Nagano (JP); Koichi Shimizu, Nagano (JP); Kenichi Sato, Souka (JP); Osamu Hanaoka, Chikuma (JP)

(73) Assignee: Futao Kaneko, Niigata-shi, Niigata (JP)

( * ) Notice: Subject to any disclaimer, the term of this patent is extended or adjusted under 35 U.S.C. 154(b) by 116 days.

(21) Appl. No.: 14/435,233

(22) PCT Filed: Oct. 10, 2013

(86) PCT No.: PCT/JP2013/006051
§ 371 (c)(1),
(2) Date: Apr. 13, 2015

(87) PCT Pub. No.: WO2014/061238
PCT Pub. Date: Apr. 24, 2014

(65) Prior Publication Data
US 2015/0293181 A1    Oct. 15, 2015

(30) Foreign Application Priority Data

Oct. 16, 2012    (JP) ................. 2012-228844

(51) Int. Cl.
*G01N 27/416* (2006.01)
*G01R 31/36* (2006.01)
(Continued)

(52) U.S. Cl.
CPC ....... *G01R 31/3679* (2013.01); *G01R 31/3634* (2013.01); *H01M 10/4285* (2013.01);
(Continued)

(58) Field of Classification Search
CPC ............ G01R 31/361; G01R 31/3624; G01R 31/3634; G01R 31/3679; H01M 10/052; H01M 10/4285; H01M 10/48; H01M 2220/20; Y02T 10/7011
USPC ....................................................... 324/426
See application file for complete search history.

(56) References Cited

U.S. PATENT DOCUMENTS

| | | | |
|---|---|---|---|
| 2010/0052617 A1* | 3/2010 | Aridome ............... | B60L 3/0046 320/132 |
| 2011/0018551 A1* | 1/2011 | Yamane .................. | B60K 6/46 324/548 |
| 2012/0116701 A1* | 5/2012 | Yuasa ................ | G01R 31/3679 702/63 |

FOREIGN PATENT DOCUMENTS

| | | |
|---|---|---|
| JP | H11-329512 A | 11/1999 |
| JP | 2001-332310 A | 11/2001 |

(Continued)

OTHER PUBLICATIONS

Nov. 19, 2013 International Search Report issued in International Patent Application No. PCT/JP2013/006051.
(Continued)

*Primary Examiner* — Nathaniel Pelton
(74) *Attorney, Agent, or Firm* — Kenja IP Law PC

(57) ABSTRACT

Provided is a simple secondary battery tester that obtains, without applying an AC signal for determination based on capacitance, the capacitance of a secondary battery from time characteristics of a current flowing to the secondary battery and a terminal voltage and determines whether the secondary battery is degraded based on the capacitance thus obtained.

20 Claims, 5 Drawing Sheets

(51) Int. Cl.
  *H01M 10/48*  (2006.01)
  *H01M 10/42*  (2006.01)
  *H01M 10/052* (2010.01)

(52) U.S. Cl.
  CPC ............ *H01M10/48* (2013.01); *G01R 31/361* (2013.01); *G01R 31/3624* (2013.01); *H01M 10/052* (2013.01); *H01M 2220/20* (2013.01); *Y02T 10/7011* (2013.01)

(56) References Cited

FOREIGN PATENT DOCUMENTS

| JP | 2009-244088 A | 10/2009 |
|----|---------------|---------|
| JP | 2010-060408 A | 3/2010 |
| JP | 2010-066232 A | 3/2010 |
| JP | 2010-272365 A | 12/2010 |
| JP | 2011-109910 A | 6/2011 |
| JP | 2012-122817 A | 6/2012 |
| WO | 2011/121692 A1 | 10/2011 |

OTHER PUBLICATIONS

Nov. 12, 2013, Notification of Reason(s) for Refusal issued by the Japan Patent Office in the corresponding Japanese Patent Application No. 2012-228844.

"Lithium-ion battery" by Hideaki Horie, published by Baifukan, Aug. 10, 2010.

* cited by examiner

SECONDARY BATTERY TESTER

CROSS REFERENCE TO RELATED APPLICATION

This application claims priority to and the benefit of Japanese Patent Application No. 2012-228844 (filed on Oct. 16, 2012), the entire contents of which are incorporated herein by reference.

TECHNICAL FIELD

This disclosure relates to a tester for determining degradation of a secondary battery.

BACKGROUND

For example, a secondary battery that is used by repeatedly charging has become essential in recent social life due to the popularization of hybrid vehicles, electric vehicles, mobile phones, and the like.

Although a secondary battery has evolved to have a large battery capacity, charging/discharging in a repeating manner gradually increases an internal change and inhibits sufficient charging/discharging, thereby reducing the life of some secondary batteries.

Therefore, especially when the secondary battery is used in a vehicle, there is a risk that the vehicle suddenly becomes undrivable due to degradation of the secondary battery. It is thus desired to use the secondary battery after determining whether the secondary battery is degraded.

As such, methods of determining degradation of the secondary battery have conventionally been developed.

For example, NPL 1 set forth the below discloses degradation determination by measuring internal resistance corresponding to degradation of a lithium-ion battery.

Also, PLT 1 set forth below discloses detection of a state of a lithium-ion secondary battery by applying an AC voltage and/or an alternating current at a particular frequency to the lithium-ion secondary battery. PLT 2 set forth below discloses a method of measuring an AC impedance of a non-aqueous electrolyte secondary battery at a predetermined frequency and estimating reversible capacity of the battery from a relational expression of the AC impedance and the reversible capacity allowing charging/discharging (a battery capacity that allows charging/discharging).

Also, PLT 3 set forth below discloses: deriving voltage-current characteristics of the lithium-ion battery; deriving an open-circuit voltage (Open-Circuit Voltage: OCV) of the lithium-ion battery based on the voltage-current characteristics thus obtained; estimating a charging capacity (State Of Charge: SOC) of the lithium-ion battery by employing current integration or the like; and determining deposition degradation based on changes in the OCV and the SOC.

PLT 4 set forth below discloses determination on degradation based on information about a change in a voltage obtained in a diagnostic mode for continuously discharging and charging the lithium-ion battery at a constant electric power.

Further, PLT 5 set forth below discloses: in charging the lithium-ion battery by employing a constant current and constant voltage scheme, setting a charging current at $C_0/(20$ hours$)$ or less, provided that the $C_0$ represents a nominal capacity of the battery; obtaining time t from when a charging voltage during charging with the constant current reaches a predetermined voltage Vs to when the charging voltage reaches an upper limit Vc of the charging voltage; and estimating the capacity (Ce) of the lithium-ion battery from the estimated capacity ratio $Ce/C_o$ by using a relational expression $Ce/C_0=At+B$ (A, B=const); and determining degradation.

A degradation determination method described in PLT 6 set forth below is as follows. That is, when the secondary battery such as the lithium-ion battery, a nickel-cadmium battery, or a nickel-metal hydride battery is connected to a charging device, a type of the secondary battery is detected and, based on a voltage of the battery, constant-current charging processing commences. During the constant-current charging processing, when the voltage of the battery reaches a reference voltage corresponding to the type of the battery, a controller starts measuring constant-current charging time. Depending on a charging control method corresponding to the type of the secondary battery being used, when the constant-current charging is switched over to constant-voltage charging, or when $-\Delta V$ is detected, the measurement of the time ends. The control unit compares the constant-current charging time obtained by the measurement and a constant-current charging time of a battery having a state of charging capacity of a brand new battery.

CITATION LIST

Patent Literatures

PTL 1: Japanese Patent Application Laid-Open Publication No. 2009-244088
PTL 2: Japanese Patent Application Laid-Open Publication No. 2012-122817
PTL 3: Japanese Patent Application Laid-Open Publication No. 2010-66232
PTL 4: Japanese Patent Application Laid-Open Publication No. 2010-60408
PTL 5: Japanese Patent Application Laid-Open Publication No. 2001-332310
PTL 6: Japanese Patent Application Laid-Open Publication No. H11-329512

Non-Patent Literature

NPL1: "Lithium-ion battery" by Hideaki Horie, published by Baifukan, August 2010

The PLT 1 and the PLT 2 set forth above determine degradation of the secondary battery of a degradation determination target by applying the AC voltage and/or the alternating current to the secondary battery of the degradation determination target.

However, a determination device that determines degradation by applying the AC voltage and/or the alternating current requires an AC power source and an impedance measuring device. Therefore, the determination device is large in size, causing inconvenience in handling. Especially when a general user using the secondary battery performs the degradation determination, the determination apparatus is desired to be simple, compact, and lightweight.

The methods described in the PLT 3 to PLT 6 and the NPL 1 determine degradation of the secondary battery by using parameters such as the internal resistance, the voltage, the charge amount, and the discharge amount, alone or in combination.

On the other hand, as a result of diligent research on determining degradation of the secondary battery by detecting capacitance of the secondary battery, the inventors have conceived a determination device that is simple, compact, and lightweight as well as being capable of determining degradation in an excellent manner.

As such, it could be helpful to provide a secondary battery tester that is simple, compact, and lightweight.

SUMMARY

A secondary battery tester includes: a voltage measuring unit with voltage terminals for measuring a voltage between a positive electrode and a negative electrode of a secondary battery without applying an AC voltage; a current measuring unit for measuring a current flowing between the positive electrode and the negative electrode of the secondary battery without applying an alternating current; a capacitance deriving means for estimating the capacitance of the secondary battery at a predetermined time from the start of measurement, using the voltage measured by the voltage measuring unit and the current measured by the current measuring unit; a storage unit for preliminarily storing temporal variation of capacitance of a normal secondary battery; and a determination means for comparing the capacitance at the predetermined time derived by the capacitance deriving means and the capacitance of the normal secondary battery at the predetermined time stored in the storage unit, and determining whether the secondary battery being measured is degraded.

Since this configuration determining degradation based on the capacitance does not require an AC power source or the like, a determination device may be simple, compact, and lightweight, allowing a general user using the secondary battery to easily evaluate the degradation determination.

The capacitance deriving means described above may derive the capacitance of the secondary battery by dividing the current measured by the current measuring unit by time differential of the voltage measured by the voltage measuring unit.

In this configuration, by dividing a current amount $i(t)$ at a desired time by a time differential $dv/dt$ of a voltage $v(t)$, the capacitance at the desired time may be derived from $C=i(t)·dt/dv$.

Also, the capacitance deriving means described above may derive the capacitance of the secondary battery by using an amount $\Delta Q$ of charge flowing in a predetermined period of time $\Delta t$ from the current measured by the current measuring unit and a changing amount $\Delta v$ of the voltage in the predetermined period of time $\Delta t$ measured by the voltage measuring unit and dividing the amount $\Delta Q$ of charge flowing in the predetermined period of time $\Delta t$ by the changing amount $\Delta v$ of the voltage in the predetermined time.

In this configuration, the amount $\Delta Q$ of charge flowing in the predetermined period of time $\Delta t$ may be derived from a current I (a mean current in the period of time)·$\Delta t$, and capacitance C may be derived from $C=\Delta Q/\Delta v$.

Also, the capacitance deriving means may derive the capacitance of the secondary battery by dividing a value obtained by carrying out time integration on the current flowing in a desired period of time $\Delta t$ by the changing amount $\Delta v$ of the voltage in the desired period of time $\Delta t$ measured by the voltage measuring unit, or by dividing a value obtained by sampling the current amount $i(t)$ in the desired period of time $\Delta t$ once or a plurality of times, followed by summing the sampling values, dividing the summed values thus obtained by the number of sampling times and then multiplying the value thus obtained by the desired period of time $\Delta t$, by the changing amount $\Delta v$ of the voltage in the desired period of time $\Delta t$ measured by the voltage measuring unit.

In this configuration, as the amount $\Delta Q$ of charge flowing in the desired period of time $\Delta t$, a value obtained by the following method may be used; a time integral $\int i(t)dt$ of the current amount $i(t)$ in the desired period of time $\Delta t$, or a value obtained by sampling the current amount $i(t)$ in the desired period of time $\Delta t$ once or a plurality of times, followed by summing the sampling values, dividing the summed values thus obtained by the number of sampling times and then multiplying the value thus obtained by the desired period of time $\Delta t$. The capacitance C may be derived from $C=\Delta Q/\Delta v$.

The secondary battery tester may include a DC power source for applying a direct current to the secondary battery of a degradation determination target, and the capacitance deriving means, during constant current charging by the DC power source, or during charging with varied voltages, may derive the capacitance based on the changing amount $\Delta v$ of the voltage in the predetermined period of time $\Delta t$ measured by the voltage measuring unit and the charge amount $\Delta Q$ in the predetermined period of time obtained from the current measured by the current measuring unit.

The storage unit preliminarily stores a plurality of combinations of the voltages and the capacitances of normal secondary batteries. The determination means, based on the voltage measured by the voltage measuring unit and the capacitance derived by the capacitance deriving means, selects one combination of the voltage and the capacitance from the plurality of combinations stored in the storage unit and compares the measured voltage and the derived capacitance with the selected voltage and capacitance.

Also, the storage unit may preliminarily store a relation between the terminal voltage between a positive electrode and a negative electrode and the capacitance of a normal secondary battery, and the determination means may compare a relation between the voltage measured by the voltage measuring unit and the capacitance derived by the capacitance deriving means and a relation between the terminal voltage between the positive electrode and the negative electrode and the capacitance of the normal secondary battery stored in the storage unit.

Further, the secondary batteries of the degradation determination target may have a connection state in which a plurality of secondary batteries are connected in parallel, in series, or in parallel and in series.

Accordingly, the secondary battery tester that is simple, compact, and lightweight may be provided.

BRIEF DESCRIPTION OF THE DRAWINGS

In the accompanying drawings.

DETAILED DESCRIPTION

Hereinafter, a secondary battery tester will be described with reference to the accompanying drawings.

Note that although the embodiments herein use a lithium-ion battery as an example of the secondary battery, the secondary battery is not limited thereto.

First Embodiment of Secondary Battery Tester

Figure 1:
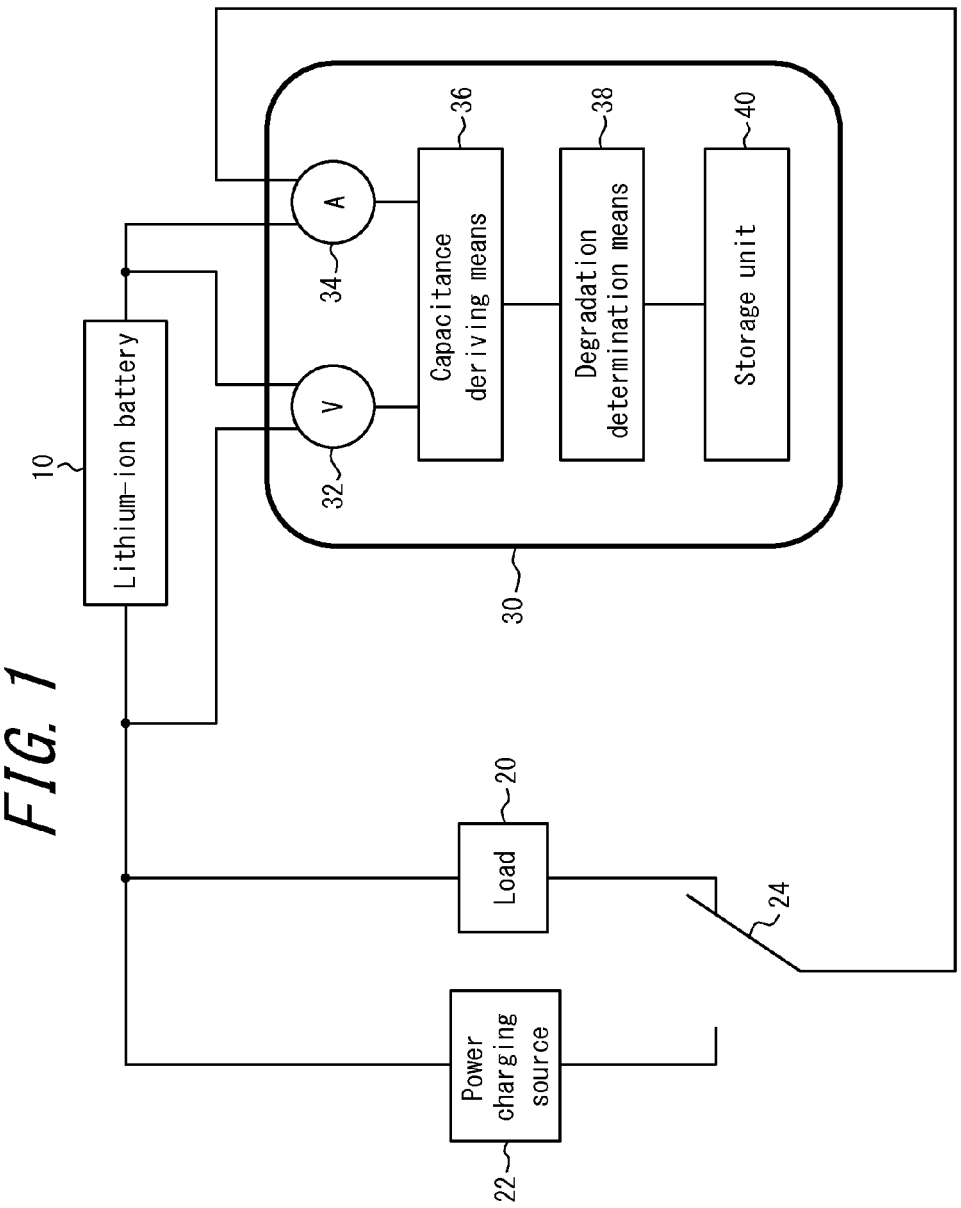
FIG. 1 is an explanatory view illustrating a secondary battery tester and a connection configuration thereof according to the first embodiment.

FIG. 1 illustrates the secondary battery tester and a connection configuration thereof according to the first embodiment.

A secondary battery tester 30 according to the present embodiment is represented by a range surrounded by bold lines in FIG. 1 and includes a voltage sensor 32, a current sensor 34, a storage unit 40, a capacitance deriving means 36, and a degradation determination means 38.

The secondary battery tester 30 measures a terminal voltage and a current of a lithium-ion battery 10 of a degradation determination target by means of the voltage sensor 32 and the current sensor 34, respectively, and calculates the capacitance of the lithium-ion battery 10 from these values thus obtained. The secondary battery tester 30, based on the capacitance and the terminal voltage stored in the storage unit 40, may determine whether the lithium-ion battery 10 is degraded.

Although the secondary battery tester 30 according to the present embodiment includes two voltage terminals connected to the voltage sensor 32 and two current terminals connected to the current sensor 34, the secondary battery tester 30 may include three terminals sharing one voltage terminal and one current terminal. A positive electrode and a negative electrode of the voltage terminal may be specified optionally.

The lithium-ion battery 10 of the degradation determination target is connected to a load 20 or a power charging source 22. As illustrated in FIG. 1, in particular, the lithium-ion battery 10 is connected to either the load 20 or the power charging source 22 via a changeover switch 24. The secondary battery tester 30 according to the present embodiment, either in a charging state or in a discharging state switched by the changeover switch 24, may determine whether the lithium-ion battery 10 is degraded based on the terminal voltage and the current thereof.

Also, the load 20 may be of any kind and either a device actually using the lithium-ion battery 10 or a dummy having internal impedance similar to the device.

That is, the degradation determination of the lithium-ion battery 10 only requires that the terminal voltage and the current of the lithium-ion battery 10 be measured by the voltage sensor 32 and the current sensor 34, respectively. Regardless of a type of the load, and also regardless of whether in the charging state or the discharging state, whether the lithium-ion battery 10 is degraded is determined by the secondary battery tester 30.

The secondary battery tester 30 according to the present embodiment will be described in detail. The secondary battery tester 30 includes the voltage sensor 32 for measuring a voltage between the positive electrode and the negative electrode (hereinafter, also simply referred to as a terminal voltage) of the lithium-ion battery 10 of the degradation determination target and the current sensor 34 for measuring current flowing to the lithium-ion battery 10. The voltage sensor 32 and the current sensor 34 correspond to the voltage measuring unit and the current measuring unit, respectively, those being referred to in the appended claims.

The secondary battery tester 30 measures the terminal voltage and the current of the lithium-ion battery 10, derives the capacitance based thereon, and then compares the capacitance with the known capacitance, thereby carrying out degradation determination.

To that end, the secondary battery tester 30 includes a capacitance deriving means 36 connected to the voltage sensor 32 and the current sensor 34, and also includes the degradation determination means 38 for carrying out the degradation determination based on the derived capacitance. The secondary battery tester 30 further includes the storage unit 40 for preliminarily storing the normal capacitance to be used for the comparison with the derived capacitance.

In particular, the capacitance deriving means 36 and the degradation determination means 38 may be substantialized by a microprocessor and a memory storing a program to operate the microprocessor. Also, the storage unit 40 may be substantialized by this memory.

The storage unit 40 stores temporal variation of the capacitance and time characteristics of the terminal voltage of a non-degraded lithium-ion battery (here, the term "non-degraded" includes slight degradation but is used for convenience). The time characteristics of the terminal voltage of the lithium-ion battery 10 is necessary for the derivation of the capacitance, determination on whether the battery is in the discharging state or in the charging state at the time of measurement of the capacitance, the determination whether the lithium-ion battery 10 is degraded based on the capacitance, and determination on end of discharging or charging.

Figure 2:
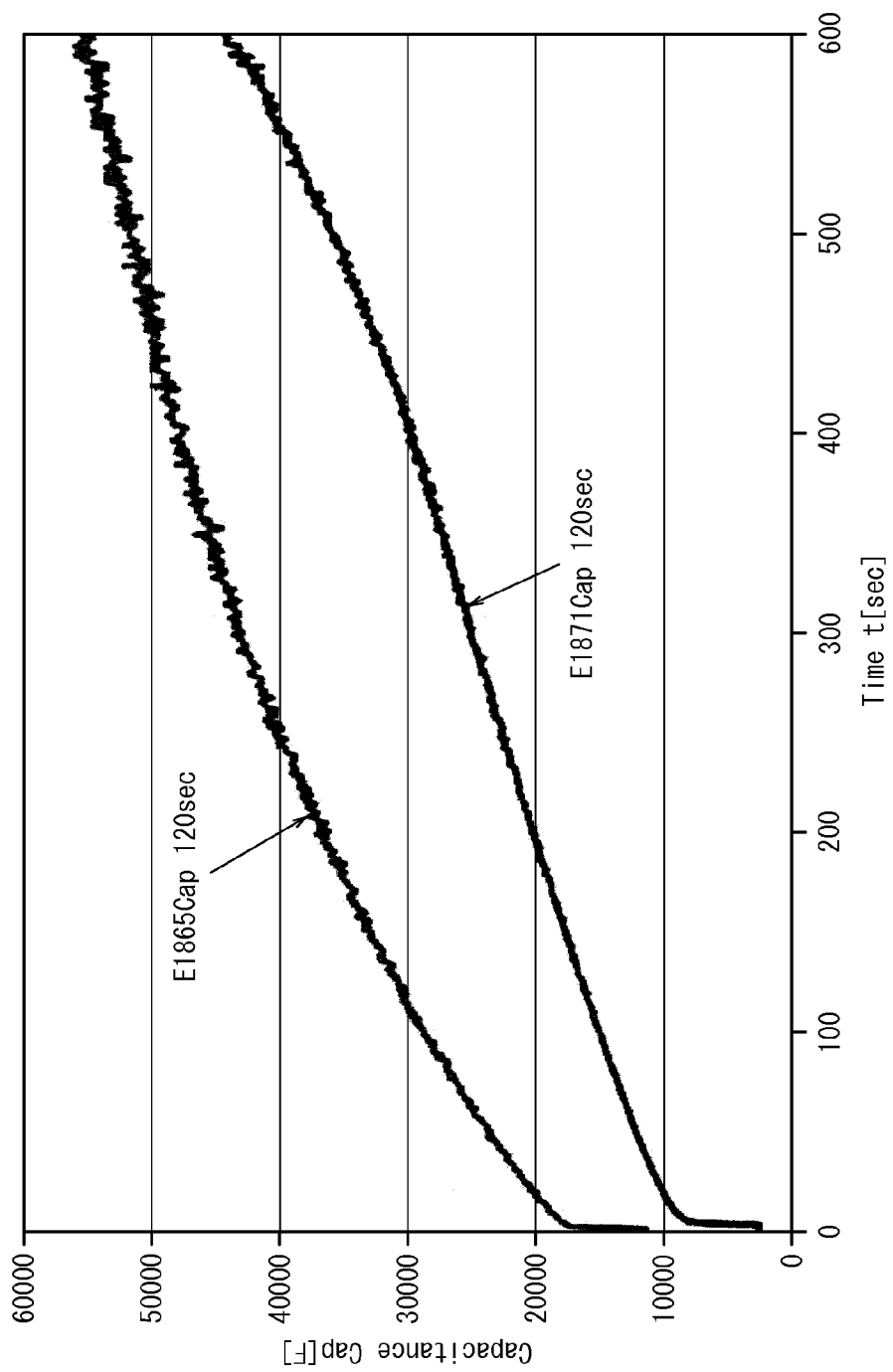
FIG. 2 is a graph illustrating temporal variation of the derived capacitances.

A graph illustrated in FIG. 2, for example, illustrates two capacitance, and one larger than the other overall indicates the temporal variation of the capacitance of the non-degraded lithium-ion battery. FIG. 2 illustrates the temporal variation of the capacitance from the start of discharge to 600 seconds thereafter.

The capacitance of the non-degraded lithium-ion battery as described above needs to be preliminary measured for a predetermined continuous period of time and stored as the temporal variation in the storage unit 40. Also, since the capacitance varies depending on types of the lithium-ion batteries, when a user uses lithium-ion batteries of a plurality of types as the degradation determination targets, it is necessary to preliminarily measure the capacitance of each of the lithium-ion batteries of the plurality of types for the predetermined continuous period of time and store the capacitance of each of the lithium-ion batteries as the temporal variation in the storage unit 40.

Second Embodiment of a Secondary Battery Tester

Figure 3:
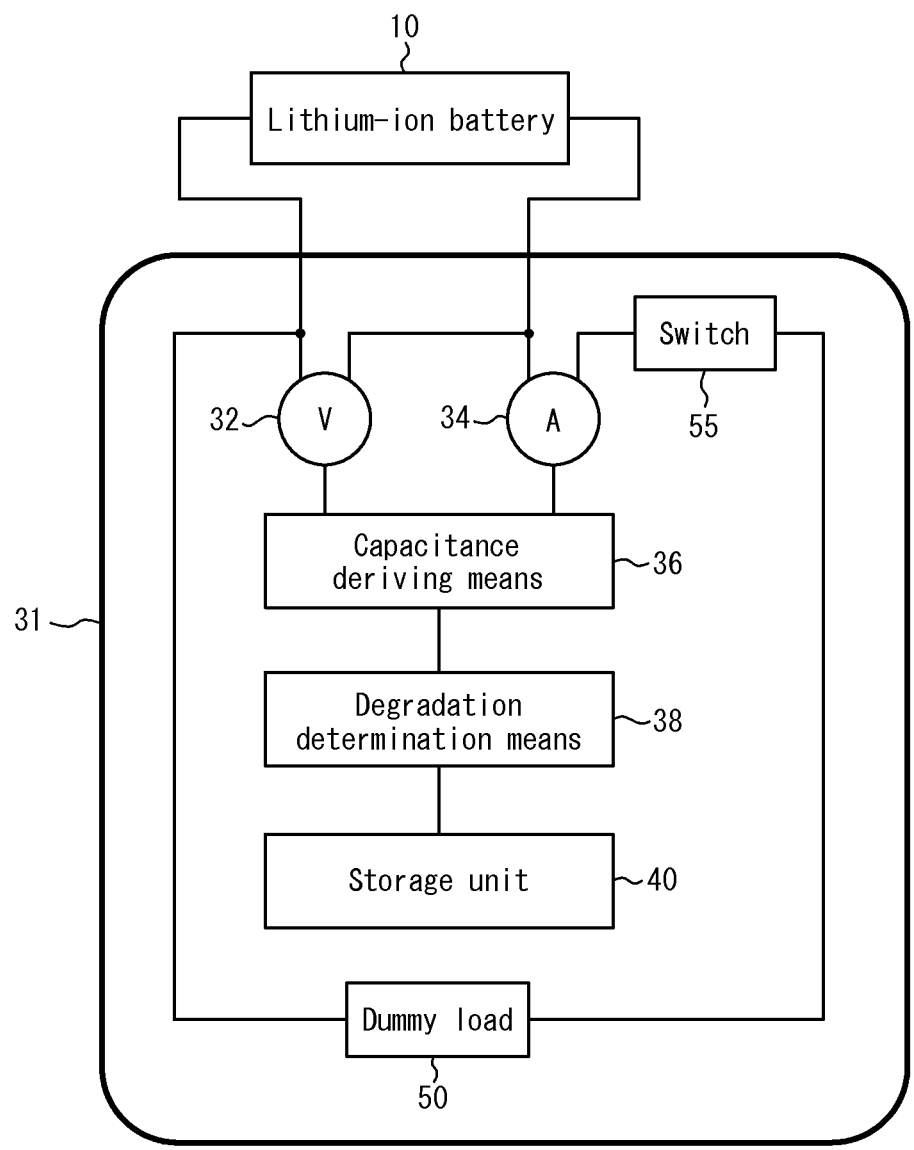
FIG. 3 is an explanatory view illustrating a secondary battery tester and a connection configuration thereof according to the second embodiment.

FIG. 3 illustrates a secondary battery tester according to the second embodiment.

A secondary battery tester 31 according to the present embodiment is configured to be able to determine, even when the load and the charging power source are not connected to the lithium-ion battery 10 of the degradation determination target, whether the lithium-ion battery 10 of the degradation determination target is degraded.

As illustrated in FIG. 3, in particular, the secondary battery tester 31 according to the present embodiment is different from the secondary battery tester 30 according to the first embodiment, in terms of including a dummy load 50 and a switch 55.

Also, the secondary battery tester 31 includes voltage terminals only as external connection terminals. Each of the positive electrode and the negative electrode of the lithium-ion battery 10 is connected to the voltage terminals of the secondary battery tester 31.

Each of the voltage terminals connected to the positive electrode or the negative electrode of the lithium-ion battery 10 is connected to the voltage sensor 32 within the secondary battery tester 31, and one of the voltage terminals branches off to connect to one terminal of the current sensor 34, while the other branches off to connect to one end of the dummy load 50. Also, the other end of the dummy load 50 is connected to one end of the switch 55, and the other end of the switch 55 is connected to the other terminal of the current sensor 34. When the switch 55 is turned on, the dummy load 50 and the lithium-ion battery 10 are connected in series, whereby the current flows to the dummy load 50.

In the secondary battery tester 31, the voltage sensor 32, the current sensor 34, the storage unit 40, the capacitance deriving means 36, and the degradation determination means 38 may be configured in the same manner as those of the first embodiment described above.

Note that a positive electrode and a negative electrode of the terminals of the secondary battery tester may be specified optionally.

(Capacitance Deriving Method 1)

There may be considered several methods of deriving the capacitance of the lithium-ion battery employed by the capacitance deriving means 36. First, a deriving method 1 will be described.

When a charge amount stored upon application of a voltage v is represented by Q, the capacitance C may be derived from a fundamental equation of a steady state: $C=Q$ (charge amount)/v (voltage). According to the present embodiment, with respect to the fundamental equation: $C=Q/v$, the capacitance C is derived from the time characteristics of the current and the voltage those being measured.

The current sensor 34 measures a current i (t) using the time t as a variable, and the current i(t) is input to the capacitance deriving means 36. Also, a voltage v(t) measured by the voltage sensor 32 is also input to the capacitance deriving means 36. The capacitance deriving means 36 obtains dv/dt by carrying out time differential of the voltage v(t). Further, the capacitance deriving means 36 divides the current i(t) by the time differential of the voltage dv/dt. The value thus obtained satisfies $i(t)/(dv/dt)=(i(t)\cdot dt)/dv$, and (i(t)·dt) represents a change dQ in the charge amount by the current i(t) flowing in a time dt. Thereby, the capacitance in the time t in accordance with the differential corresponding to $C=Q/v$, i.e., $i(t)/(dv/dt)=(i(t)\cdot dt)/dv=dQ/dv=C$ may be derived.

(Capacitance Deriving Method 2)

Next, a capacitance deriving method 2 of the lithium-ion battery employed by the capacitance deriving means 36 will be described. In this method, with respect to the fundamental equation of the capacitance $C=Q/v$, the capacitance $C=\Delta Q/\Delta v$ is derived from a changing amount $\Delta Q$ of the charge amount and a changing amount $\Delta v$ of the voltage in a predetermined period of time $\Delta t$.

The current sensor 34 inputs the current measured in the predetermined period of time $\Delta t$ to the capacitance deriving means 36. The capacitance deriving means 36 derives a mean value I of the applied currents. The capacitance deriving means 36, assuming that the charge amount flowing in the predetermined period of time $\Delta t$ is represented by $\Delta Q$, derives the $\Delta Q$ from $\Delta Q=I\cdot \Delta t$.

Also, the voltage measured by the voltage sensor 32 is input to the capacitance deriving means 36. The capacitance deriving means 36 derives the changing amount $\Delta v$ of the voltage in the predetermined period of time $\Delta t$, the same as those used for the derivation of the charge amount $\Delta Q$. With respect to the fundamental equation of the capacitance $C=Q/v$, from the changing amount $\Delta Q$ of the charge amount and the changing amount $\Delta v$ of the voltage in a predetermined period of time $\Delta t$, the capacitance C may be derived from the equation $C=\Delta Q/\Delta v$. That is, the capacitance deriving means 36 divides the changing amount $\Delta Q$ of the charge amount (i.e., $I\cdot \Delta t$) by the changing amount $\Delta v$ of the voltage, $(\Delta Q/\Delta v=I\cdot \Delta t/\Delta v=C)$, and thus derives the capacitance C.

(Capacitance Deriving Method 3)

Next, a capacitance deriving method 3 of the lithium-ion battery employed by the capacitance deriving means 36 will be described.

The current sensor 34 inputs the measured current to the capacity deriving means 36 at any time. The capacitance deriving means 36 derives the value $\int i(t)dt$ obtained by carrying out time integration on the current i(t) flowing at the time t in a desired period of time $\Delta t$ from the time t to (t+$\Delta t$), that is, the changing amount $\Delta Q$ of the charge amount flowing in the period of time $\Delta t$. Alternately, the capacitance deriving means 36 samples the current amount i(t) flowing in the desired period of time $\Delta t$ from the time t to (t+$\Delta t$) once or a plurality of times, divides the sample value thus obtained or a sum of the sample values thus obtained by the number of sampling times, and then multiples the value thus obtained by the desired period of time $\Delta t$. That is, the capacitance deriving means 36 derives the changing amount $\Delta Q$ of the charge amount by carrying out the sampling.

The voltages sensor 32 inputs the measured voltage to the capacitance deriving means 36 at any time.

The capacitance deriving means 36 divides the changing amount $\Delta Q$ of the charge amount, which is either the value $\int i(t)dt$ obtained by carrying out the time integration on the current i(t) flowing in a desired period of time $\Delta t$, or the value obtained by sampling the current amount flowing in the desired period of time $\Delta t$, dividing a sum of the sample values thus obtained by the number of sampling times, and multiplying a value thus obtained by the desired period of time $\Delta t$, by the changing amount $\Delta v$ of the voltage in the desired period of time $\Delta t$, and thus derives the capacitance C.

(Capacitance Deriving Method 4)

Next, a capacitance deriving method 4 of the lithium-ion battery employed by the capacitance deriving means 36 will be described.

This deriving method may derive the capacitance in a charging state in which the current flows to the lithium-ion battery 10 in a direction opposite to the current flowing in the discharging state. In particular, the changeover switch 24 in the circuit in FIG. 1 is switched to connect to the power charging source 22 such that the power charging source 22 is connected to the lithium-ion battery 10 of the degradation determination target, and the capacitance is derived from the terminal voltage and the current when the lithium-ion battery 10 is being charged by the power charging source 22.

Here, a case in which the power charging source 22 carries out a constant current charge to the lithium-ion battery 10 will be described.

The voltage sensor 32 measures a charging voltage that varies during charging, and inputs the charging voltage to the capacitance deriving means 36 at any time.

Also, the current sensor 34 measures a charging current during the charging and inputs the charging current to the capacitance deriving means 36. Since there should be no change in the current during the constant current charge in principle, the current I being input has no temporal variation and is an approximately constant value.

The capacitance deriving means 36 derives the capacitance C based on the changing amount $\Delta v$ of the voltage v(t) in the predetermined period of time $\Delta t$ from the desired time t to (t+$\Delta t$) that has been input, the current I having being input, and the predetermined period of time $\Delta t$. That is, as described in the capacitance deriving method 2, the charge amount $\Delta Q$ flowing into the lithium-ion battery 10 in the predetermined period of time $\Delta t$ is derived from I·$\Delta t$, and the capacitance C is derived from C=$\Delta Q/\Delta v$. Therefore, the capacitance C may be derived from $\Delta Q/\Delta v$=I·$\Delta t/\Delta v$.

Although the constant current charge is carried out for charging the lithium-ion battery 10 and the capacitance is derived from the time characteristics of the voltage and the current at that time in the above method, the charging current may be varied during the charging.

In employing such a charging method varying the charging current, the voltage sensor 32 measures the changing amount $\Delta v$ of the voltage during the period of time from the desired time t to (t+$\Delta t$) and inputs the voltage thus measured to the capacitance deriving means 36 at any time. Also, the current sensor 34 measures the charging current during the charging and inputs the current thus measured to the capacitance deriving means 36.

The capacitance deriving means 36, based on the changing amount $\Delta v$ of the voltage in the predetermined period of time $\Delta t$ from the desired time t to (t+$\Delta t$) being input and the mean value I of the current in the time t+$\Delta t$ from the desired time t being input as well as the predetermined period of time $\Delta t$, obtains the charge amount $\Delta Q$ flowing in the period of time t+$\Delta t$ from the desired time t, and thus derives the capacitance C. That is, as described in the capacitance deriving method 2, the charge amount $\Delta Q$ is derived from I·$\Delta t$, and the capacitance C is derived from Q$\Delta/\Delta v$. Therefore, the capacitance C may be derived from $\Delta Q/\Delta v$=I·$\Delta t/\Delta v$.

Note that, the mean value I of the current in the period of time $\Delta t$ from the desired time t to (t+$\Delta t$) being input may be the current obtained by sampling the current i(t) flowing in the period of time $\Delta t$ from the desired time t to (t+$\Delta t$) once or a plurality of times in the period of time $\Delta t$ and dividing the sample value thus obtained or a sum of the sample values thus obtained by the number of sampling times.

(Degradation Determination Method 1)

The capacitance C of the lithium-ion battery in the desired time t derived by the capacitance deriving means 36 is compared, by the degradation determination means 38, with the temporal variation of the capacitance of the non-degraded normal lithium-ion battery preliminarily stored in the storage unit 40 for degradation determination.

The following is a description about the degradation determination method, with reference to the graph illustrating the time characteristics of the capacitance in FIG. 2. In FIG. 2, a horizontal axis represents an elapsed time (unit: sec) from the start of discharge, and a vertical axis represents the capacitance (unit: F).

The capacitance larger than the other overall in FIG. 2 indicates the capacitance of the non-degraded lithium-ion battery. The other capacitance smaller overall indicates capacitance of a degraded lithium-ion battery.

The degradation determination means 38 compares the capacitance C of the lithium-ion battery at a certain time elapsed from the start of discharge derived by the capacitance deriving means 36 with the capacitance of the non-degraded lithium-ion battery at the certain time. For example, it is assumed that the capacitance of the lithium-ion battery of the degradation determination target is 16000 F, while the capacitance of the non-degraded lithium-ion battery at 120 seconds from the start of discharge stored in the storage unit 40 is 30000 F.

The degradation determining means 38 compares those capacitance at the same elapsed time. The degradation determining means 38 determines that the lithium-ion battery is not degraded when the capacitance C derived is the same as the capacitance of the non-degraded lithium-ion battery stored in the storage unit 40, and determines that the lithium-ion battery is degraded when the capacitance C derived is smaller than the capacitance stored in the storage unit 40. Here, as the lithium-ion battery is degraded more, the capacitance C derived becomes further smaller than the capacitance of the non-degraded lithium-ion battery.

Figure 4:
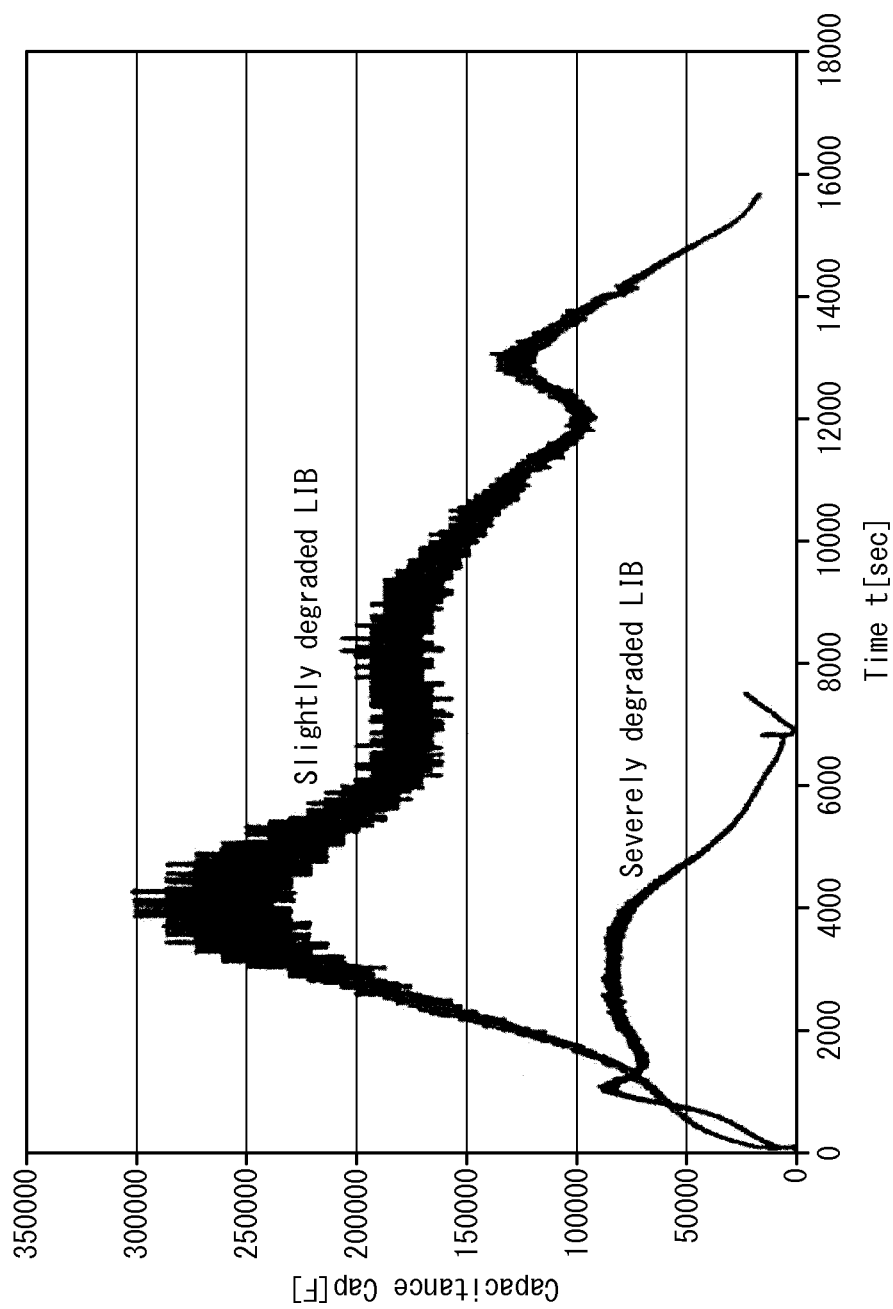
FIG. 4 is a graph illustrating the temporal variation of the capacitance with a horizontal axis representing a time longer than that of the graph in FIG. 2.

FIG. 4 illustrates the temporal variation of the capacitance when the elapsed time is longer than that in FIG. 2.

In FIG. 4, the capacitance of the non-degraded lithium-ion battery is measured from the start of discharge to 16000 seconds, and the temporal variation of the capacitance is stored in the storage unit 40. Maximum capacitance of the non-degraded lithium-ion battery is approximately 300000 F when 4000 seconds elapsed. The capacitance of the non-degraded lithium-ion battery becomes small at 16000 seconds from the start of discharge and, simultaneously, the terminal voltage thereof also becomes small, and the discharge stops. On the other hand, the degraded lithium-ion battery has a peak capacity, which is as small as 90000 F, between 1000 sec to 4000 sec from the start of discharge. The capacitance of the degraded lithium-ion battery becomes small at 7000 seconds from the start of discharge and, simultaneously, the terminal voltage thereof also becomes small, and the discharge stops.

As can be seen in FIG. 4, when the capacitance of the lithium-ion battery of the degradation determination target is measured for a time longer than that in FIG. 2, the capacitance of the non-degraded lithium-ion battery is larger and maintained for a longer time, while the capacitance of the degraded lithium-ion battery is smaller and reduces in a short time. Therefore, by utilizing a large difference in the time characteristics of the capacitance between the non-degraded lithium-ion battery and the degraded lithium-ion battery, the degradation determining means 38 may carry out the degradation determination in an excellent manner.

(Degradation Determination Method 2)

The following describes an embodiment to determine the degradation of the lithium-ion batteries of a plurality of types.

Figure 5:
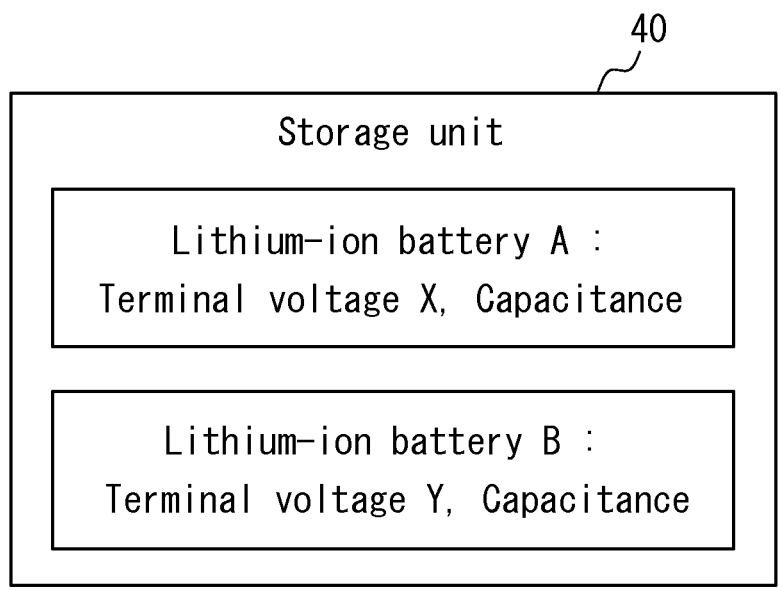
FIG. 5 is an explanatory view illustrating a storage unit storing capacitances of lithium-ion batteries of a plurality of types.

As illustrated in FIG. 5, first, the storage unit 40 preliminarily stores each of the temporal variations of capacitance of the non-degraded lithium-ion batteries of the plurality of types and, in relation thereto, each of voltages between the positive electrode and the negative electrode of the lithium-ion batteries of the plurality of types. Although in FIG. 5 the storage unit 40 stores the changing amount of the voltage between the terminals and the temporal variation of the capacitance of each lithium-ion batteries A and B of different types, the temporal variations of more than two lithium-ion batteries may be stored.

Subsequently, the voltage sensor 32 inputs the voltage measured between the terminals to the capacitance deriving means 36 and, simultaneously, the current sensor 34 inputs the measured current to the capacitance deriving means 36. The degradation determination means 38, based on the voltage between the terminals and the capacitance those input by the capacitance deriving means 36, selects a lithium-ion battery having corresponding voltage and capacitance stored in the storage unit 40.

Then, the degradation determination means 38 compares the temporal variation of the capacitance of the lithium-ion battery being selected and the capacitance C of the lithium-ion battery derived by the capacitance deriving means 36 for the degradation determination. In particular, in a manner similar to that described above, the degradation determination unit 38 compares the capacitance of the selected lithium-ion battery and the capacitance C derived at the same point of time. When the capacitance C derived is the same as the capacitance of the lithium-ion battery selected from the storage unit 40, the degradation determination unit 38 determines that the lithium-ion battery of the degradation determination target is not degraded. When the capacitance C derived is smaller than the capacitance of the lithium-ion battery selected from the storage unit 40, the degradation determination unit 38 determines that the lithium-ion battery of the degradation determination target is degraded.

(Degradation Determination Method 3)

Note that the degradation determination means 38 may carry out the degradation determination based on, instead of the temporal variation of the capacitance, a relation between a change in the voltage between the positive electrode and the negative electrode of the non-degraded lithium-ion battery and a change in the capacitance.

The storage unit 40 preliminarily stores the changing amount of the voltage between the positive terminal and the negative terminal of the non-degraded lithium ion battery 10 and, in relation thereto, the capacitance of the non-degraded lithium ion battery 10. In general, the voltage between the terminals gradually becomes lower with the discharge time. Therefore, the present embodiment, based on the measured voltage between the terminals (that reduces over time), compares the capacitance corresponding to the voltage between the terminals.

In particular, the degradation determination means 38 compares the capacitance of the non-degraded lithium-ion battery and the capacitance C derived at the same voltage between the terminals. When the capacitance C derived is the same as the capacitance stored in the storage unit 40, the degradation determination means 38 determines that the lithium-ion battery of the degradation determination target is not degraded. When the capacitance C derived is smaller than the capacitance stored in the storage unit 40, the degradation determination means 38 determines that the lithium-ion battery of the degradation determination target is degraded.

Other Embodiments

In each of the embodiments described above, the degradation determination for one lithium-ion battery has been described.

However, the degradation determination target may be a plurality of lithium-ion batteries connected in parallel, in series, or in parallel and in series. In this case, the storage unit needs to preliminarily store temporal variations of capacitance of the plurality of lithium-ion batteries connected in parallel, in series, or in parallel and in series.

Note that the secondary battery targeted by the tester is not limited to the lithium-ion battery but may be a nickel-cadmium battery or a nickel-hydrogen battery.

REFERENCE SIGNS LIST

10 lithium-ion battery
20 load
22 power charging source
24 changeover switch
30, 31 secondary battery tester
32 voltage sensor
34 current sensor
36 capacitance deriving means
38 degradation determination means
40 storage unit
50 dummy load
55 switch

The invention claimed is:

1. A secondary battery tester comprising:
a voltage measuring unit for measuring a terminal voltage between a positive electrode and a negative electrode of a secondary battery without applying an AC voltage;
a current measuring unit for measuring a current flowing between the positive electrode and the negative electrode of the secondary battery without applying an alternating current;
a capacitance deriving means for deriving, from the voltage measured by the voltage measuring unit and the current measured by the current measuring unit, capacitance of the secondary battery at a predetermined time from the start of measurement;
a storage unit for preliminarily storing temporal variation of capacitance of a normal secondary battery; and
a determination means for comparing the capacitance at the predetermined time derived by the capacitance deriving means and the capacitance at the predetermined time obtained from the temporal variation of the capacitance stored in the storage unit, and determining whether the secondary battery being measured is degraded.

2. The secondary battery tester according to claim 1, wherein
the capacitance deriving means derives the capacitance of the secondary battery by dividing the current measured by the current measuring unit by time differential of the voltage measured by the voltage measuring unit.

3. The secondary battery tester according to claim 1, wherein
the capacitance deriving means derives the capacitance of the secondary battery by deriving an amount of charge flowing in a predetermined time from the current measured by the current measuring unit, deriving a changing amount of the voltage in the predetermined time measured by the voltage measuring unit, and then dividing the amount of charge flowing in the predetermined time by the changing amount of the voltage in the predetermined time.

4. The secondary battery tester according to claim 1, wherein
the capacitance deriving means derives the capacitance of the secondary battery by dividing a value obtained by carrying out time integration on the current flowing in a desired period of time, or a value obtained by sampling a current amount flowing in the desired period of time once or a plurality of times, followed by dividing a sample value thus obtained or a sum of sample values thus obtained by the number of sampling times and then multiplying the value thus obtained by the desired period of time, by the changing amount of the voltage measured by the voltage measuring unit in the desired period of time.

5. The secondary battery tester according to claim 1, comprising a DC power source for applying a direct current to the secondary battery of a degradation determination target, wherein
the capacitance deriving means, during constant current charging by the DC power source, or during charging with varied voltages, derives the capacitance based on the changing amount of the voltage measured by the voltage measuring unit and a charge amount in a predetermined time obtained from the current measured by the current measuring unit.

6. The secondary battery tester according to claim 1, wherein
the storage unit preliminarily stores a plurality of combinations of voltages and capacitances of normal secondary batteries, and
the determination means, based on the voltage measured by the voltage measuring unit and the capacitance derived by the capacitance deriving means, selects one combination of the voltage and the capacitance stored in the storage unit and compares a combination thus selected with the voltage measured by the voltage measuring unit and the capacitance derived by the capacitance deriving means.

7. The secondary battery tester according to claim 2, wherein
the storage unit preliminarily stores a plurality of combinations of voltages and capacitances of normal secondary batteries, and
the determination means, based on the voltage measured by the voltage measuring unit and the capacitance derived by the capacitance deriving means, selects one combination of the voltage and the capacitance stored in the storage unit and compares a combination thus selected with the voltage measured by the voltage measuring unit and the capacitance derived by the capacitance deriving means.

8. The secondary battery tester according to claim 3, wherein
the storage unit preliminarily stores a plurality of combinations of voltages and capacitances of normal secondary batteries, and
the determination means, based on the voltage measured by the voltage measuring unit and the capacitance derived by the capacitance deriving means, selects one combination of the voltage and the capacitance stored in the storage unit and compares a combination thus selected with the voltage measured by the voltage measuring unit and the capacitance derived by the capacitance deriving means.

9. The secondary battery tester according to claim 4, wherein
the storage unit preliminarily stores a plurality of combinations of voltages and capacitances of normal secondary batteries, and
the determination means, based on the voltage measured by the voltage measuring unit and the capacitance derived by the capacitance deriving means, selects one combination of the voltage and the capacitance stored in the storage unit and compares a combination thus selected with the voltage measured by the voltage measuring unit and the capacitance derived by the capacitance deriving means.

10. The secondary battery tester according to claim 5, wherein
the storage unit preliminarily stores a plurality of combinations of voltages and capacitances of normal secondary batteries, and
the determination means, based on the voltage measured by the voltage measuring unit and the capacitance derived by the capacitance deriving means, selects one combination of the voltage and the capacitance stored in the storage unit and compares a combination thus selected with the voltage measured by the voltage measuring unit and the capacitance derived by the capacitance deriving means.

11. The secondary battery tester according to claim 1, wherein
the storage unit preliminarily stores a relation between the terminal voltage between the positive electrode and the negative electrode and the capacitance of a normal secondary battery, and
the determination means compares a relation between the voltage measured by the voltage measuring unit and the capacitance derived by the capacitance deriving means and a relation between the terminal voltage between the positive electrode and the negative electrode and the capacitance of a normal secondary battery stored in the storage unit.

12. The secondary battery tester according to claim 2, wherein
the storage unit preliminarily stores a relation between the terminal voltage between the positive electrode and the negative electrode and the capacitance of a normal secondary battery, and
the determination means compares a relation between the voltage measured by the voltage measuring unit and the capacitance derived by the capacitance deriving means and a relation between the terminal voltage between the positive electrode and the negative electrode and the capacitance of a normal secondary battery stored in the storage unit.

13. The secondary battery tester according to claim 3, wherein
the storage unit preliminarily stores a relation between the terminal voltage between the positive electrode and the negative electrode and the capacitance of a normal secondary battery, and
the determination means compares a relation between the voltage measured by the voltage measuring unit and the capacitance derived by the capacitance deriving means and a relation between the terminal voltage between the positive electrode and the negative electrode and the capacitance of a normal secondary battery stored in the storage unit.

14. The secondary battery tester according to claim 4, wherein
the storage unit preliminarily stores a relation between the terminal voltage between the positive electrode and the negative electrode and the capacitance of a normal secondary battery, and
the determination means compares a relation between the voltage measured by the voltage measuring unit and the capacitance derived by the capacitance deriving means and a relation between the terminal voltage between the positive electrode and the negative electrode and the capacitance of a normal secondary battery stored in the storage unit.

15. The secondary battery tester according to claim 5, wherein the storage unit preliminarily stores a relation between the terminal voltage between the positive electrode and the negative electrode and the capacitance of a normal secondary battery, and the determination means compares a relation between the voltage measured by the voltage measuring unit and the capacitance derived by the capacitance deriving means and a relation between the terminal voltage between the positive electrode and the negative electrode and the capacitance of a normal secondary battery stored in the storage unit.

16. The secondary battery tester according to claim 1, wherein the secondary battery of the degradation determination target has a connection state in which a plurality of secondary batteries are connected in parallel, in series, or in parallel and in series.

17. The secondary battery tester according to claim 2, wherein the secondary battery of the degradation determination target has a connection state in which a plurality of secondary batteries are connected in parallel, in series, or in parallel and in series.

18. The secondary battery tester according to claim 3, wherein the secondary battery of the degradation determination target has a connection state in which a plurality of secondary batteries are connected in parallel, in series, or in parallel and in series.

19. The secondary battery tester according to claim 4, wherein the secondary battery of the degradation determination target has a connection state in which a plurality of secondary batteries are connected in parallel, in series, or in parallel and in series.

20. The secondary battery tester according to claim 5, wherein the secondary battery of the degradation determination target has a connection state in which a plurality of secondary batteries are connected in parallel, in series, or in parallel and in series.

* * * * *